(12) United States Patent
Liu

(10) Patent No.: US 10,347,660 B2
(45) Date of Patent: Jul. 9, 2019

(54) ARRAY SUBSTRATE AND MANUFACTURING METHOD THEREOF

(71) Applicant: Shenzhen China Star Optoelectronics Technology Co., Ltd., Shenzhen, Guangdong (CN)

(72) Inventor: Yang Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 194 days.

(21) Appl. No.: 15/117,887

(22) PCT Filed: Jul. 20, 2016

(86) PCT No.: PCT/CN2016/090596
§ 371 (c)(1),
(2) Date: Aug. 10, 2016

(87) PCT Pub. No.: WO2017/215075
PCT Pub. Date: Dec. 21, 2017

(65) Prior Publication Data
US 2018/0197887 A1 Jul. 12, 2018

(30) Foreign Application Priority Data
Jun. 16, 2016 (CN) .................. 2016 1 04386185

(51) Int. Cl.
*H01L 27/12* (2006.01)
*H01L 29/24* (2006.01)
(Continued)

(52) U.S. Cl.
CPC .......... *H01L 27/1225* (2013.01); *H01L 21/77* (2013.01); *H01L 27/12* (2013.01);
(Continued)

(58) Field of Classification Search
CPC ........... H01L 29/7869; H01L 29/78648; H01L 27/124; H01L 27/1225
(Continued)

(56) References Cited

U.S. PATENT DOCUMENTS 9,437,435 B2   9/2016 Wang et al.
9,716,119 B2   7/2017 Li
(Continued)

FOREIGN PATENT DOCUMENTS

CN    101644866 A    2/2010
JP    2000216406 A   8/2000

*Primary Examiner* — Jonathan Han
(74) *Attorney, Agent, or Firm* — Andrew C. Cheng

(57) ABSTRACT

The present disclosure discloses an array substrate, the array substrate comprises a substrate as well as a thin film transistor and a pixel electrode formed on the substrate, wherein the top of the thin film transistor is formed a floating gate electrode, at least portion of the floating gate electrode and the pixel electrode are made of the same material. The present disclosure also discloses a manufacturing method of an array substrate. Through this way, the present disclosure simultaneously forms a floating gate electrode in the manufacturing process of the pixel electrode, the pixel electrode and the floating gate electrode is formed by a mask, there is no need to add a mask, thus achieving the manufacture of the dual gate thin film transistor and the array substrate, briefing the process, reducing the production costs.

11 Claims, 6 Drawing Sheets

(51) Int. Cl.
*H01L 29/786* (2006.01)
*H01L 29/788* (2006.01)
*H01L 21/77* (2017.01)
*H01L 27/15* (2006.01)

(52) U.S. Cl.
CPC ............ *H01L 27/127* (2013.01); *H01L 27/15* (2013.01); *H01L 29/24* (2013.01); *H01L 29/788* (2013.01); *H01L 29/7869* (2013.01); *H01L 29/78648* (2013.01)

(58) Field of Classification Search
USPC ........ 257/40, 43; 438/104, 151, 157; 349/47
See application file for complete search history.

(56) References Cited

U.S. PATENT DOCUMENTS

| | | | |
|---|---|---|---|
| 2004/0129933 A1 | 7/2004 | Nathan et al. | |
| 2008/0315286 A1* | 12/2008 | Ieda | H01L 21/28273 257/316 |
| 2012/0104385 A1* | 5/2012 | Godo | H01L 29/78648 257/43 |
| 2014/0340608 A1* | 11/2014 | Yamazaki | G02F 1/1368 349/47 |
| 2016/0093643 A1* | 3/2016 | Jang | H01L 29/78648 257/43 |
| 2016/0155759 A1* | 6/2016 | Yamazaki | H01L 29/41733 257/43 |

* cited by examiner

ARRAY SUBSTRATE AND MANUFACTURING METHOD THEREOF

BACKGROUND OF THE DISCLOSURE

1. Field of the Disclosure

The present disclosure relates to a display technical field, and in particular to an array substrate and a manufacturing method thereof.

2. The Related Arts

The metal oxide semiconductor thin film transistor is considered to be the flat panel display key technology of next generation by the good device performance and lower process cost. However, along with the display performance improving, the technologies such as high resolution, narrow border and so on demand more requirements such as mobility and stability from the performance of the thin film transistor in the array substrate. Comparing to the low-temperature polysilicon technology commonly used in current high-end monitors, lower mobility and stability limit the integration that the metal oxide semiconductor thin film transistor is used in the driver circuit, hindering the application of the metal oxide semiconductor thin film transistor used in the high-end monitors.

Therefore, on the basis of the original structure is developed the dual gate metal semiconductor thin film transistor, the variation of the threshold voltage can be adjusted though adjusting the floating gate voltage, improving the stability of the device, meanwhile, the mobility of the device can be improved to a certain extent, however, in the manufacturing process of the dual gate metal oxide semiconductor thin film transistor and the array substrate thereof, it is needed to ass a mask to form the floating gate electrode, moreover, the complexity of the gate driver increases, thus increasing the production costs.

SUMMARY OF THE DISCLOSURE

The purpose of present disclosure is to provide an array substrate and a manufacturing method thereof, which can solve the issue that in the manufacturing process of the dual gate metal oxide semiconductor thin film transistor and the array substrate thereof, a mask is needed to add to form a floating gate electrode, thus increasing the production costs.

In order to solve the above technical issue, a technical solution adopted by the present disclosure is: to provide an array substrate, wherein said array substrate comprises a substrate, a thin film transistor formed on said substrate and a pixel electrode, wherein the top of said thin film transistor is formed a floating gate electrode, said floating gate electrode and said pixel electrode being formed by the same pattern proves, at least portion of said floating gate electrode and said pixel electrode being made of the same metal oxide semiconductor material.

In order to solve the above technical issue, another technical solution adopted by the present disclosure is: to provide an array substrate, wherein said array substrate comprises a substrate, a thin film transistor formed on said substrate and a pixel electrode, wherein the top of said thin film transistor is formed a floating gate electrode, at least portion of said floating gate electrode and said pixel electrode being made of the same material.

Wherein said material is a metal oxide semiconductor material.

Wherein said metal oxide semiconductor material is ZnO radical, $SnO_2$ radical or $In_2O_3$ radical metal oxide semiconductor material.

Wherein floating gate electrode comprises a stacked first floating gate electrode and second floating gate electrode, wherein said first floating gate electrode and said pixel electrode are made of the same material.

Wherein the material of said first floating gate electrode and said pixel electrode is metal oxide semiconductor material, the material of said second floating gate electrode is metal material.

Wherein said floating gate electrode and said pixel electrode being formed by the same pattern process.

Wherein said thin film transistor further comprises a bottom gate electrode formed on said substrate, a gate insulating layer covered on said bottom gate electrode, a semiconductor layer which is formed on said gate insulating layer and is corresponded with said bottom gate electrode, a source electrode and a drain electrode which are formed on said semiconductor layer and are respectively contacted with both sides of said semiconductor layer, and a passivation layer covered on said source electrode and said drain electrode, wherein said gate insulating layer and said passivation layer further extended between said pixel electrode and said substrate, on said passivation layer being provided a via hole, said pixel electrode being electrically connected with one of said source electrode or said drain electrode through said via hole.

Wherein said floating gate electrode and said bottom gate electrode are electrically connected or insulated with each other.

In order to solve the above technical issue, the other technical solution adopted by the present disclosure is: to provide a manufacturing method of an array substrate, wherein said manufacturing method comprises the following steps:

to provide substrate;

to form a bottom structure of a dual gate thin film transistor;

to form at least one material layer on the bottom structure of said dual gate thin film transistor, carrying on the pattern process to said material layer, further simultaneously forming a floating gate electrode and a pixel electrode of said dual gate thin film transistor.

Wherein said material layer is a metal oxide semiconductor material layer.

Wherein said metal oxide semiconductor material is ZnO radical, $SnO_2$ radical or $In_2O_3$ radical metal oxide semiconductor material.

Wherein the steps of forming at least one material layer on the bottom structure of said dual gate thin film transistor, carrying on the pattern process to said material layer comprise:

to sequentially form a first material layer and a second material layer on the bottom structure of said dual gate thin film transistor and to carry on the pattern process to said first material layer and said second material layer, further forming said floating gate electrode formed by said stacked first material layer and second material layer and said pixel electrode formed by a single-layer structure of said first material layer.

Wherein said first material layer is metal oxide semiconductor material layer, said second material layer is metal material layer.

Wherein said floating gate electrode and pixel electrode of said dual gate thin film transistor are formed by the same pattern process.

Wherein the bottom structure of said dual gate thin film transistor comprises a bottom gate electrode formed on said substrate, a gate insulating layer covered on said bottom gate electrode, a semiconductor layer which is formed on said gate insulating layer and is corresponded with said bottom gate electrode, a source electrode and a drain electrode which are formed on said semiconductor layer and are respectively contacted with both sides of said semiconductor layer, and a passivation layer covered on said source electrode and said drain electrode, wherein said gate insulating layer and said passivation layer further extended between said pixel electrode and said substrate, on said passivation layer being provided a via hole, said pixel electrode being electrically connected with one of said source electrode or said drain electrode through said via hole.

Wherein said floating gate electrode and said bottom gate electrode are electrically connected or insulated with each other.

The benefit effect of the present disclosure is: to distinguish the situation of the prior art, the present disclosure provides an array substrate and a manufacturing method thereof, forming a floating gate electrode on the top of a thin film transistor, at least portion of the floating gate electrode and the pixel electrode are made of the same metal oxide semiconductor material. Through this way, the present disclosure simultaneously forms a floating gate electrode in the manufacturing process of the pixel electrode, the pixel electrode and the floating gate electrode is formed by a mask, there is no need to add a mask, thus achieving the manufacture of the dual gate thin film transistor and the array substrate, briefing the process, reducing the production costs.

DETAILED DESCRIPTION OF THE PREFERRED EMBODIMENTS

In order to enable those skilled personnel to better understand the technical aspect of the present disclosure, the following will combine the drawings and the embodiments to further describe an array substrate and a manufacturing method thereof of the present disclosure.

Figure 1:
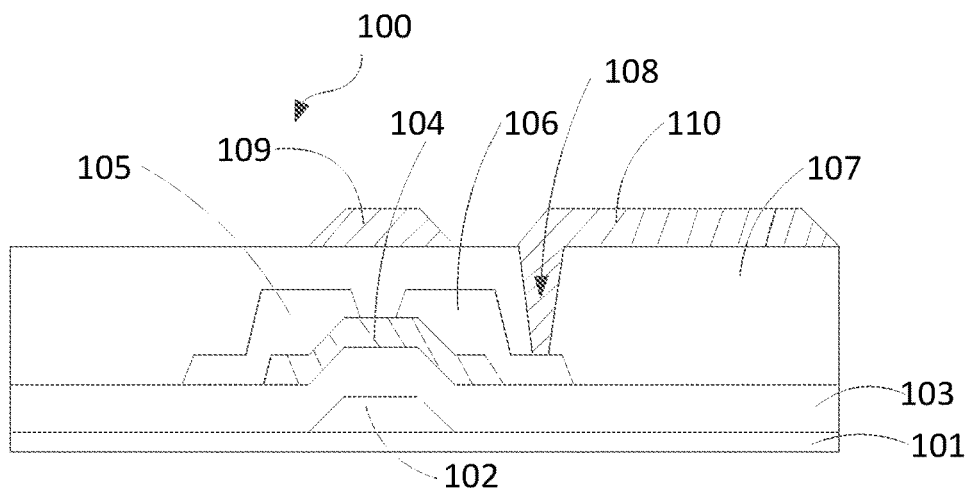
FIG. 1 is a structure diagram of the first embodiment of the array substrate of the present disclosure.

Refer to FIG. 1, the first embodiment of the array substrate of the present disclosure comprises:

A substrate 101 and a thin film transistor 100 and a pixel electrode 110 formed on the substrate 101, wherein the top of the thin film transistor 100 is formed a floating gate electrode 109, at least portion of the floating gate electrode 109 and the pixel electrode 110 are made of the same material.

Specifically, the substrate 101 can be made of polyethylene naphthalene, PEN, polyethylene terephthalate, PET, polyimide, PI, or glass.

The thin film transistor is the main component of the array substrate, which is used to control the pixel to turn on or turn off, the thin film transistor can be divided into three types according to the variation of used material, one is amorphous silicon thin film transistor which is currently the most widely used, such amorphous silicon material forms an electronic circuit at low temperature; another one is low-temperature polysilicon thin film transistor, such polysilicon material enables high-resolution, conductivity is good, but the size of the display panel is limited; the other one is metal oxide semiconductor thin film transistor, the electron mobility of such metal oxide semiconductor material best, which is able to produce the clearer or larger display panel. In practical applications, according to the different requirements, the thin film transistor can be optionally made of the different materials.

In the present embodiment, the thin film transistor 100 is optionally the metal oxide semiconductor thin film transistor 100, the thin film transistor 100 comprises a bottom gate electrode 102 formed on the substrate 101, a gate insulating layer 103 covered on the gate electrode 102, a semiconductor layer 104 formed on the gate insulating layer 103 and corresponded to the bottom gate electrode 102, a source electrode 105 and a drain electrode 106 which are formed on the semiconductor layer 104 and are respectively contacted with both sides of the semiconductor layer 104, and a passivation layer 107 covered on the source electrode 105 and the drain electrode 106, wherein the gate insulating layer 103 and the passivation layer 107 further extended between the pixel electrode 110 and the substrate 101, on the passivation layer 107 is provided a via hole 108, the pixel electrode 110 is electrically connected with one of the source electrode 105 or the drain electrode 106 through the via hole 108.

The top of the thin film transistor 100 is also formed a floating gate electrode 109, the bottom gate 102 and the floating gate electrode 109 constitute a dual gate thin film transistor structure 100, the thin film transistor 100 of such structure can be adjusted through the same or the different dual gate voltage, achieving the variation of the threshold voltage, improving the stability of the thin film transistor 100, meanwhile, the mobility of the thin film transistor 100 can be improved to a certain extent.

Wherein the formed bottom gate electrode 102 can be formed a metal layer (not shown) on the substrate 101 through sputtering or other optional manners, the material of the first metal layer comprises but is not limited to gold, silver, copper or iron and so on, forming a bottom gate electrode 102 after using a mask to expose and develop the first metal layer;

On the bottom gate 102 and substrate 101 is deposited a gate insulating layer 103, the gate insulating layer 103 is covered on the bottom gate electrode 102, the gate insulating layer 103 can optionally adopt the materials such as SiNx, SiOx and so on;

On the gate insulation layer 103 is deposited a semiconductor layer 104, in order to make the formed thin film transistor 100 be the metal oxide semiconductor thin film transistor 100, the material of the adopted semiconductor layer 104 is the metal oxide semiconductor material, which is optionally ZnO radical, $SnO_2$ radical or $In_2O_3$ radical metal oxide semiconductor material, through a mask process, which comprises photoresist coating, exposure and development, etching process and so on, forming a semiconductor layer 104 having a specific shape, the semiconductor layer 104 is corresponded to the bottom gate electrode 102, which comprises channel, doped layer and storage capacitor (not shown);

On the semiconductor 104 is deposited a second metal layer (not shown), the second metal layer is covered on both exposed ends of the semiconductor layer 104 and the gate insulating layer 103, the material of the second metal layer comprises but is not limited to gold, silver, copper or iron and so on, through a mask process, which comprises photoresist coating, exposure and development, etching process and so on, forming a source electrode 105 and a drain electrode 106;

On the source electrode 105 and the drain electrode 106 is deposited a passivation 107, the passivation 107 is covered on the exposed portion of the semiconductor layer 104 and the gate insulating layer 103, the passivation layer 107 optionally adopts the materials such as SiNx, SiOx and so on, through a mask process, carrying on the process of photoresist coating, exposure and development, etching and so on to the passivation layer 107, forming a via hole 108;

On the passivation layer 107 is deposited a second metal oxide semiconductor (not shown), the metal oxide semiconductor is covered on the via hole 108, through a mask process, which comprises photoresist coating, exposure and development, etching process and so on, meanwhile, forming a floating gate electrode 109 and a pixel electrode 110, since there is the metal oxide semiconductor material in the via hole 108, therefore, the pixel electrode 110 is electrically connected with the drain electrode 106 through the via hole 108.

Obviously, the materials of the floating gate electrode 109 and the pixel electrode 110 are the same, which are the metal oxide semiconductor material. The floating gate electrode 109 and the pixel electrode 110 are formed in the same pattern proves, namely, in a mask process, comparing to the traditional process in which requires a additional mask to form floating gate 109, the present embodiment achieves the more stable dual gate thin film transistor structure 100 under the circumstance of not increasing mask, brief the process, reducing the production costs.

Figure 2:
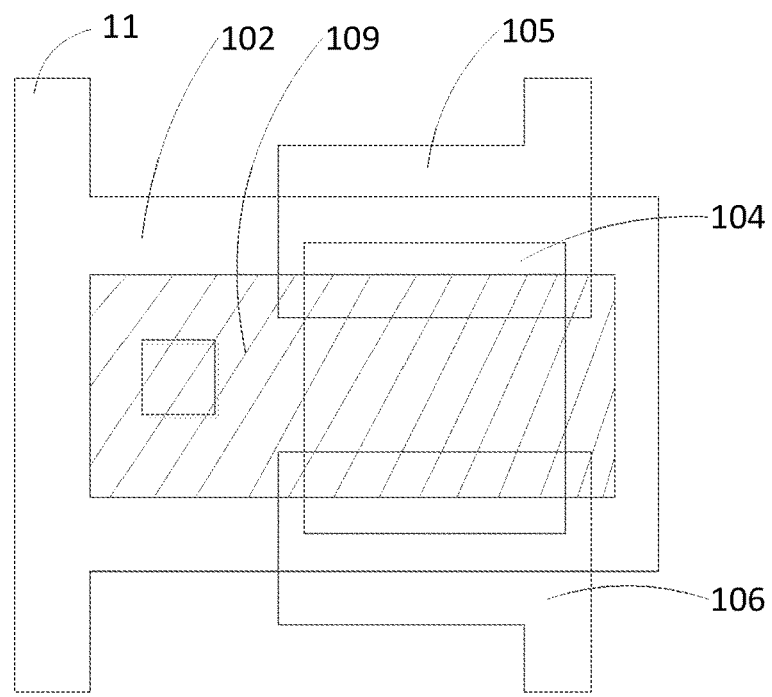
FIG. 2 is a top view schematic diagram of the connection of the floating gate electrode and the bottom gate electrode in the first embodiment of the array substrate of the present disclosure.
Figure 3:
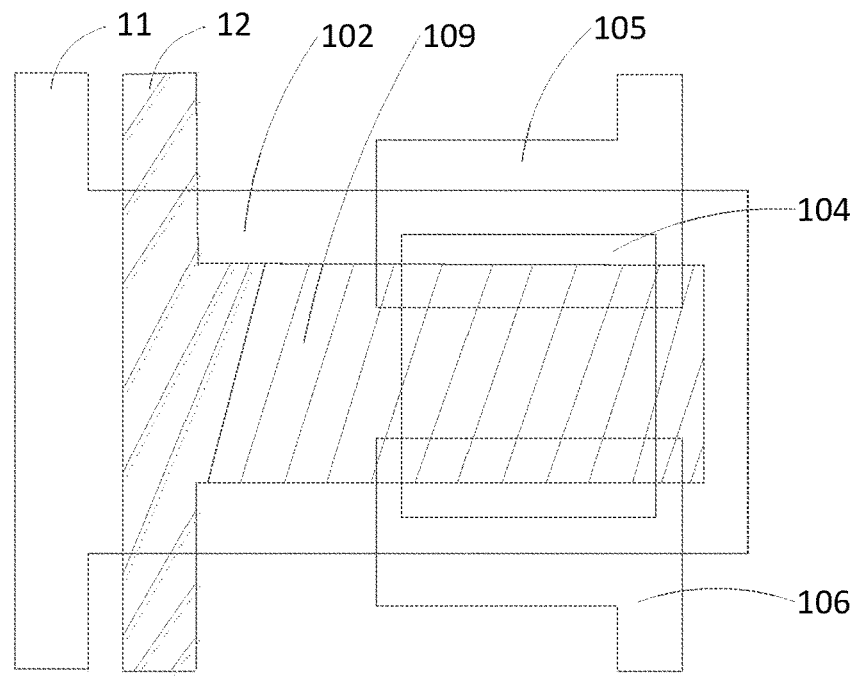
FIG. 3 is a top view schematic diagram of which the floating gate electrode and the bottom gate electrode are insulated with each other in the first embodiment of the array substrate of the present disclosure.

Refer to FIG. 2 and FIG. 3, in the present embodiment, the floating gate electrode 109 and the bottom gate electrode 102 can be electrically connected or insulated with each other. FIG. 2 is a top view schematic diagram of the connection of the floating gate electrode 109 and the bottom gate electrode 102, since the floating gate electrode 109 and the bottom gate electrode 102 are electrically connected with each other, using the same scan line 11 to simultaneously drive the floating gate electrode 109 and the bottom gate electrode 102, there is no need additional driving circuit, both driving voltages of which are the same, improving the stability of the thin film transistor 100, reducing the threshold voltage drift;

FIG. 3 is a top view schematic diagram of which the floating gate electrode 109 and the bottom gate electrode 102 are insulated with each other, therefore, an additional scan line 12 is required, which and the scan line 11 constitute two scan lines 11/12, the scan line 11 drives the bottom gate electrode 102, the scan line 12 drives the floating gate 109, achieving the same or the different voltage control, thereby improving the stability of the thin film transistor 100, reducing the threshold voltage drift.

Figure 4:
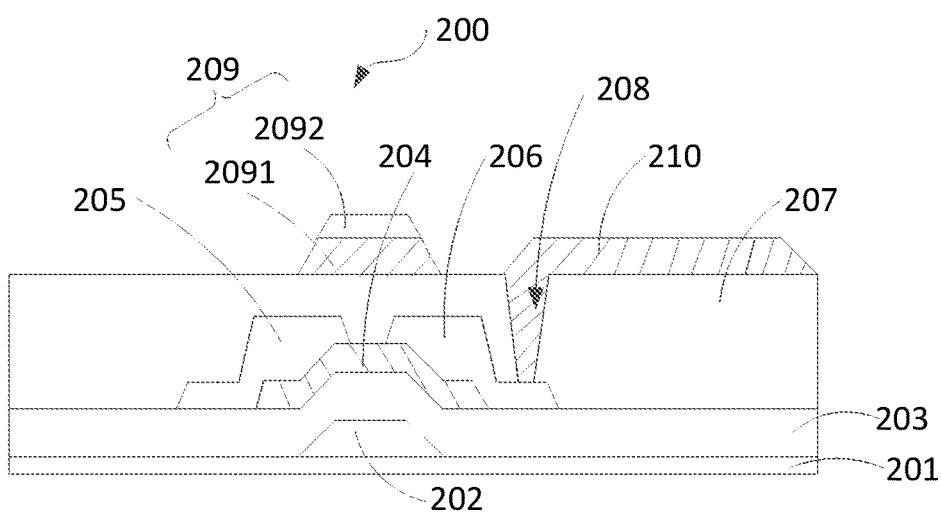
FIG. 4 is a structure diagram of the second embodiment of the array substrate of the present disclosure.

Refer to FIG. 4, FIG. 4 is a structure diagram of the second embodiment of the array substrate of the present disclosure. In the present embodiment, the array substrate comprises a substrate 201 and a thin film transistor 200 formed on the substrate 201 and a pixel electrode 210.

The thin film transistor 200 comprises a bottom gate electrode 202 formed on the substrate 201, a gate insulating layer 203 covered on the gate electrode 202, a semiconductor layer 204 formed on the gate insulating layer 203 and corresponded to the bottom gate electrode 202, a source electrode 205 and a drain electrode 206 which are formed on the semiconductor layer 204 and are respectively contacted with both sides of the semiconductor layer 204, and a passivation layer 207 covered on the source electrode 205 and the drain electrode 206, wherein the gate insulating layer 203 and the passivation layer 207 further extended between the pixel electrode 210 and the substrate 201, on the passivation layer 207 is provided a via hole 108, the pixel electrode 210 is electrically connected with one of the source electrode 205 or the drain electrode 206 through the via hole 208, the above circumstance is similar to the above described embodiment, there is no more description.

The top of the thin film transistor 200 is also formed a floating gate electrode 209, the floating electrode 209 comprises a first floating gate electrode 2091 and a second floating gate electrode 2092 provided in a pile, the forming process of the floating gate electrode 209 and the pixel electrode 210 is specifically:

On the passivation layer 207 is deposited a metal oxide semiconductor (not shown), the metal oxide semiconductor is covered on the via hole 208, the metal oxide semiconductor material is ZnO radical, $SnO_2$ radical or $In_2O_3$ radical and so on;

And then covering a metal layer (not shown) on the metal oxide semiconductor, the material of the metal layer comprises but is not limited to aluminum, molybdenum, copper, silver and so on, through a mask process, optionally using a half-tone mask to carry on the pattern process to the metal oxide semiconductor layer and the metal layer, forming a first floating gate electrode 2091, a second floating gate electrode 2092 and a pixel electrode 210, the first floating gate electrode 2091 and the pixel electrode 210 are formed by the metal oxide semiconductor layer, both materials of which are the same, the second floating gate electrode 2092 is formed by the metal layer, between the first floating gate 2091 and the second floating gate electrode 2092 has an electrical effect, so that electrons can move between the two layers.

Wherein the floating gate electrode 209 and the bottom gate electrode 202 can be electrically connected or insulated with each other, forming the structure similar to FIG. 2 and FIG. 3.

Obviously, the floating gate electrode 209 and the pixel electrode 210 are formed in a mask process which carries on the pattern process to the metal oxide semiconductor layer and the metal layer, the partial material of the floating gate electrode 209 is adopted the same material as the pixel electrode, thereby omitting the traditional process that requires an additional mask to form a floating gate electrode 209 process, briefing the process, reducing the production costs.

To be described is that in the other embodiment, the floating gate electrode can be formed by one or more materials, but meet the requirement that at least one material in the floating gate electrode is adopted the same material as the pixel electrode, namely, the floating gate electrode and the pixel electrode are formed on a mask process.

Figure 5:
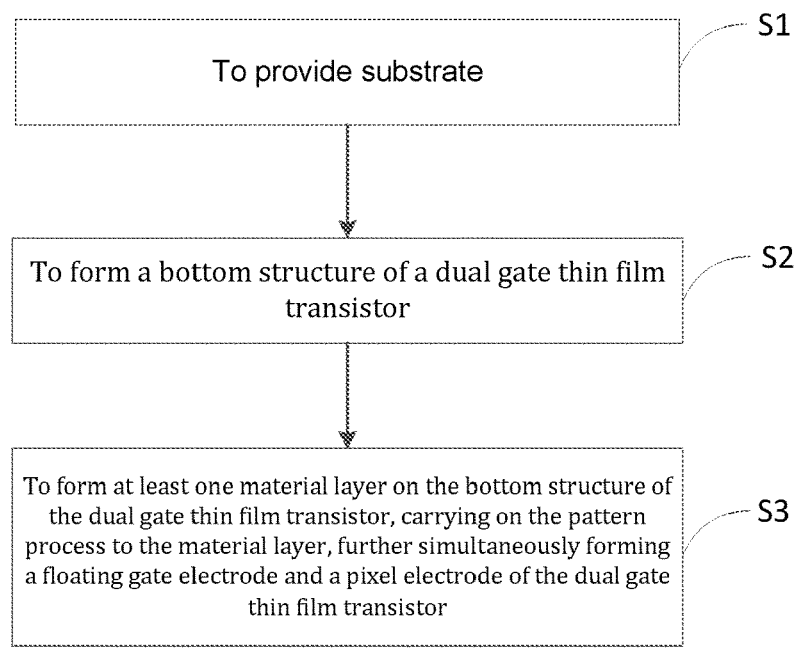
FIG. 5 is a flow chart diagram of the first embodiment of the manufacturing method of the array substrate of the present disclosure.
Figure 6A:
FIG. 6a to FIG. 6h is a sectional view schematic diagram of the array substrate of each step in FIG. 5.
Figure 6B:
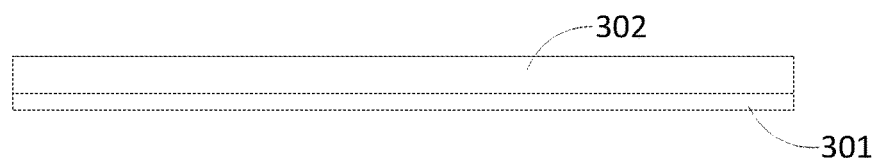
Figure 6C:
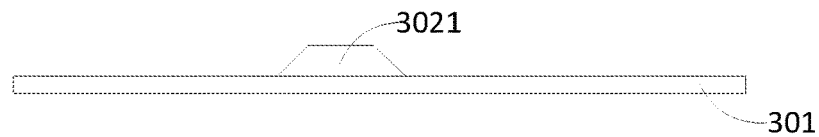

FIG. 5 is a flow chart diagram of the first embodiment of the manufacturing method of the array substrate of the present disclosure, FIG. 6a to FIG. 6h is a sectional view schematic diagram of the array substrate of each step in FIG. 5, refer to FIG. 5 and FIG. 6, the manufacturing method of the array substrate comprises the following steps:

S1: to provide a substrate 301;

Specifically, the substrate 301 can be made of polyethylene naphthalene, PEN, polyethylene terephthalate, PET, polyimide, PI, or glass, please refer to FIG. 6a.

S2: to form a bottom structure of a dual gate thin film transistor on the substrate 301, the bottom structure optionally comprises a bottom gate electrode 3021, a gate insulating layer 303, a semiconductor layer 304, a source electrode 305 and a drain electrode 306, a passivation layer 307 and a via hole 308, certainly, in the other embodiments, the bottom structure can also comprise the other portion, or just the partial structure described above, to achieve the function of the thin film transistor as the base.

The steps specifically comprises:

S101: to form a metal layer 302 on the substrate 301 through sputtering or other optional manners, the material of the first metal layer 302 comprises but is not limited to gold, silver, copper or iron and so on, please refer to FIG. 6a;

S102: to use a mask process to carry on the pattern process to the first metal layer 302 in order to form a bottom gate electrode 3021;

It is able to use the yellow light manufacturing process, forming a photolithographic pattern after coating photoresist, exposure and development, carrying on the pattern process to the first metal layer 302 through the manner of stripping photoresist after etching, forming a bottom gate electrode 3021. The bottom gate electrode 3021 can be placed on the middle of the top surface of the substrate 301, please refer to FIG. 6c.

The pattern of the top view of the bottom gate electrode 3021 comprises but is not limited to: a linear pattern, a curve pattern, a polygonal pattern, a circular pattern, an oval pattern, or a star pattern and so on, it can be realized that the specific pattern shape can be determined according to the actual utilization, the embodiment of the present disclosure will not specifically limit here.

Figure 6D:
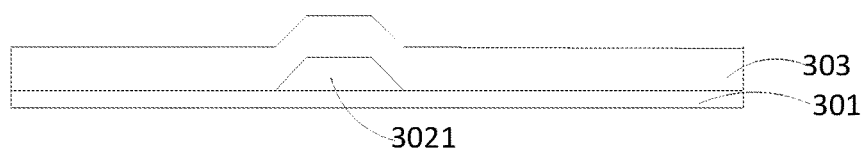
Figure 6E:
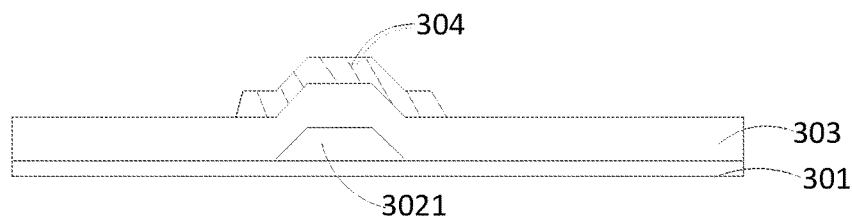
Figure 6F:
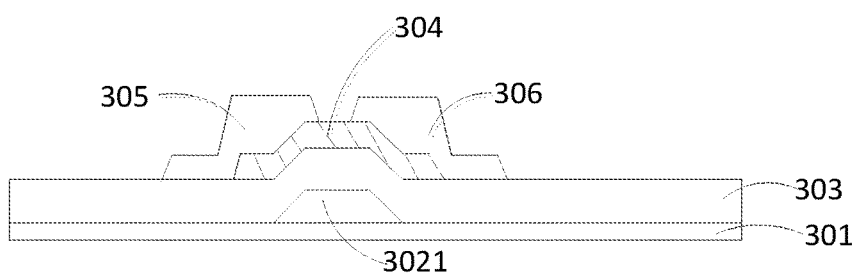
Figure 6G:
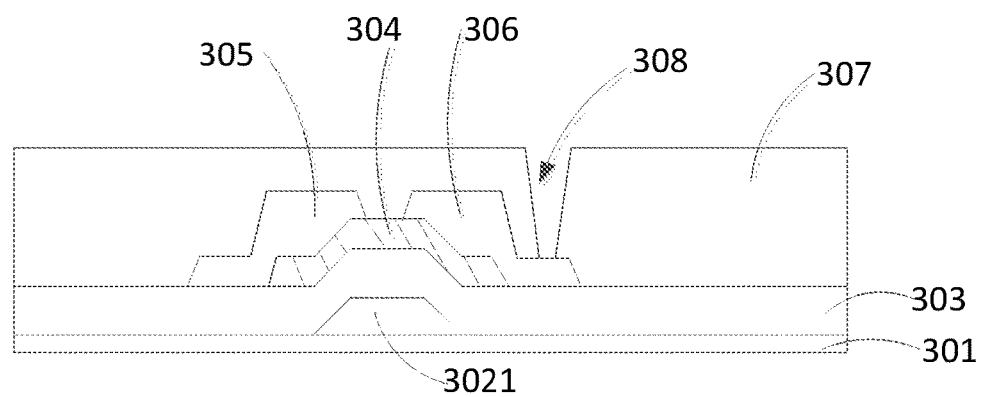

S103: to deposit a gate insulating layer 303 on the bottom gate electrode 3021 and the substrate 301, the gate insulating layer 303 covers the bottom gate electrode 3021;

Optionally depositing a gate insulating layer 303 on the bottom gate electrode 3021 and the substrate 301 through using the method of chemical vapor, the gate insulating layer 303 covers the bottom gate electrode 3021, the gate insulating layer 303 can optionally adopt SiNx, SiOx and so on, please refer to FIG. 6d;

S104: to deposit a first metal oxide semiconductor layer 304 on the gate insulating layer 303, carrying on the pattern process to the first metal oxide semiconductor layer 304 in order to form a semiconductor layer 304 having a specific shape;

The material of the first metal oxide semiconductor layer 304 is optionally ZnO radical, SnO$_2$ radical or In$_2$O$_3$ radical metal oxide semiconductor material, through coating photoresist, forming a photolithographic pattern after exposure and development, forming a semiconductor layer 304 having a specific shape through the manner of stripping photoresist after etching, the semiconductor layer 304 is corresponded to the bottom gate electrode 3021, which can comprise the channel, the doped layer and the storage capacitor portion (not shown), please refer to FIG. 6e;

S105: to deposit a second metal layer (not shown) on the semiconductor layer 304, the second metal layer covers both exposed ends of the semiconductor 304 and the gate insulating layer 303, the material of the second metal layer comprises but is not limited to gold, silver, copper or iron and so on, through coating photoresist, forming a photolithographic pattern after exposure and development, stripping photoresist after etching, forming a source electrode 305 and a drain electrode 306, please refer to FIG. 6f;

S106: to deposit a passivation layer 307 on the source electrode 305 and drain electrode 306, the passivation 307 covers the exposed portion of the semiconductor layer 304 and the gate insulating layer 303, the passivation layer 307 can optionally adopt SiNx, SiOx and so on, through a mask process, carrying on the process of coating photoresist, exposure and development, etching and so on to the passivation 307, forming a via hole 308, please refer to FIG. 6g.

S3: to form at least on material layer on the bottom structure of the dual gate thin film transistor, carrying on the pattern process, thereby simultaneously forming a floating gate electrode 309 and a pixel electrode 310 of the dual gate thin film transistor.

Figure 6H:
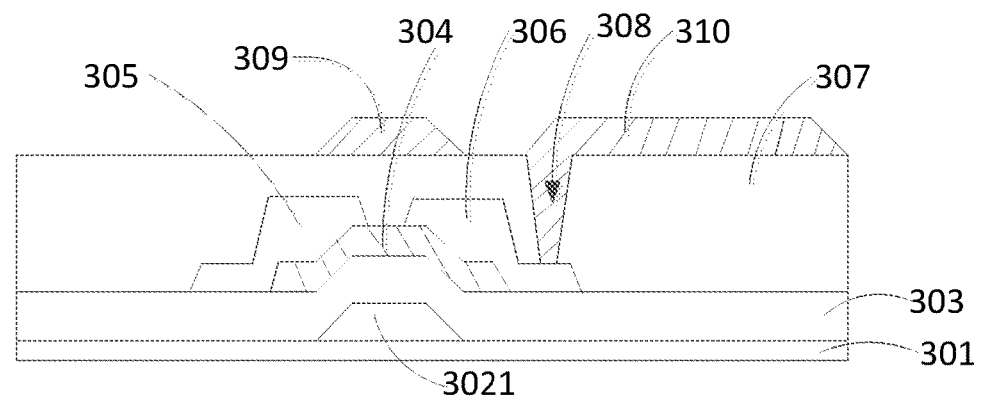

Specifically, to deposit a second metal oxide semiconductor layer (not shown) on the bottom structure of the dual gate thin film transistor, which namely is the passivation 307, the material of the second metal oxide semiconductor layer is optionally ZnO radical, SnO$_2$ radical or In$_2$O$_3$ radical and so on, the second metal oxide semiconductor covers the via hole 308, using a mask process, carrying on the process of coating photoresist, exposure and development, etching and so on to the second metal oxide semiconductor layer, simultaneously forming a floating gate electrode 309 and the pixel electrode 310, since there is the metal oxide semiconductor material in the via hole 308, therefore, the pixel electrode 310 is electrically connected with the drain electrode 306 through the via hole 308, please refer to FIG. 6h.

The floating gate electrode 309 and the pixel electrode 310 are simultaneously formed in the proves of carrying on the pattern process to the second metal oxide semiconductor layer, therefore, the materials of the floating gate electrode 309 and the pixel electrode 310 are metal oxide semiconductor material, comparing to the traditional process in which requires a additional mask to form floating gate 309, the present embodiment does not individually increase mask process, achieving the more stable manufacture of the dual gate thin film transistor and the array substrate thereof through the above serial steps, brief the process, reducing the production costs.

Figure 7:
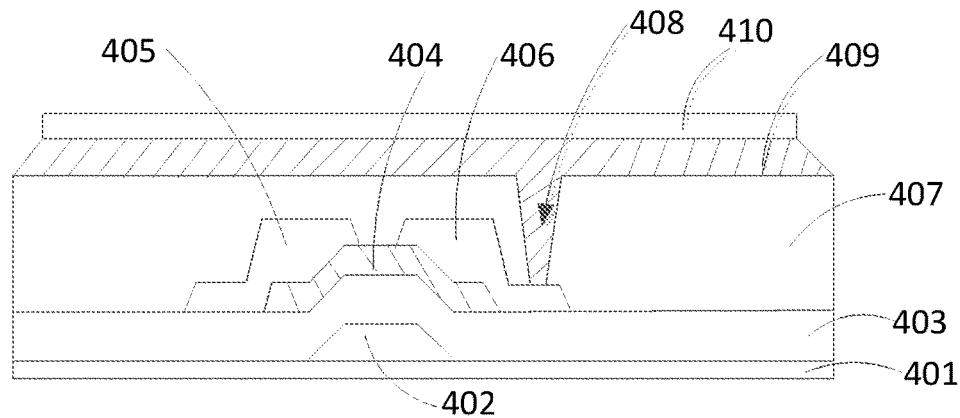
FIG. 7 is a sectional view schematic diagram of the array substrate forming the first material layer and the second material layer in the second embodiment of the manufacturing method of the present disclosure.
Figure 8:
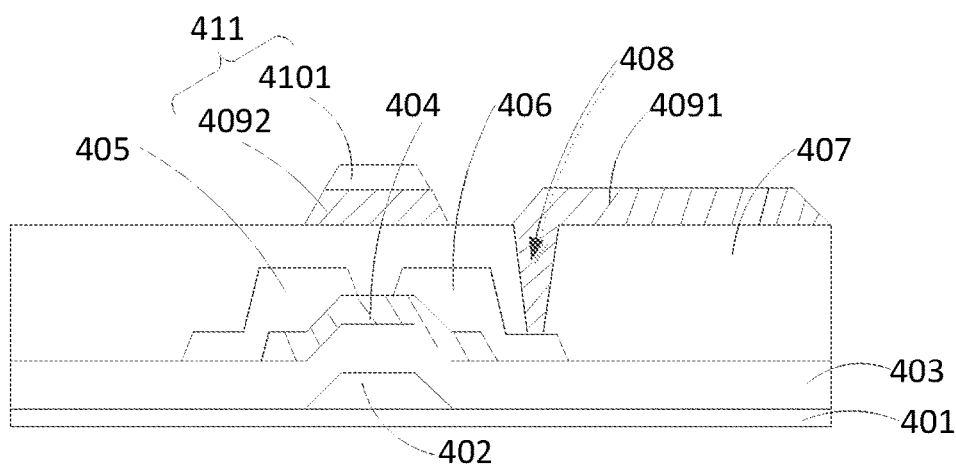
FIG. 8 is a sectional view schematic diagram of the array substrate forming the floating gate electrode and the pixel electrode in the second embodiment of the manufacturing method of the array substrate of the present disclosure.

The second embodiment of the manufacturing method of the array substrate of the present disclosure, the forming process of the bottom structure of the dual thin film transistor is similar to the first embodiment, there is no more description, the difference is the forming process of the floating gate electrode, please refer to FIG. 7 and FIG. 8, which is specifically:

Sequentially forming a first material layer 409 and a second material layer 410 on the bottom structure of the dual gate thin film transistor, and carrying on the pattern proves to the first material layer 409 and the second material layer 410, thereby forming a floating gate electrode 411 which is formed by the first material layer 409 and the second material layer 410 in a pile and a pixel electrode 4091 which is formed by the single layer structure of the first material layer 409.

Specifically, the first material layer 409 can be optionally a metal oxide semiconductor layer 409, the second material layer 410 can be optionally a metal layer 410, sequentially forming a metal oxide semiconductor layer 409 and a metal layer 410 on the bottom structure of the dual gate thin film transistor, through a mask process, forming a photolithographic pattern after carrying on the process of coating photoresist, exposure and development to the metal oxide semiconductor layer 409 and the metal layer 410, and then stripping photoresist after etching, simultaneously forming a floating gate electrode 411 and a pixel electrode 4091;

The floating gate electrode 411 is formed in a pile by two structures of the first floating gate electrode 4092 and the second floating gate electrode 4101, the first floating gate electrode 4092 and the pixel electrode 4091 are formed by the metal oxide semiconductor layer 409, the material is optionally ZnO radical, $SnO_2$ radical or $In_2O_3$ radical and so on, the second floating gate electrode 4101 is formed by the metal layer 410, the material is optionally aluminum, molybdenum, copper, or silver and so on.

Obviously, the partial material of the floating gate electrode 411 is the same as the material of the pixel electrode 4091, making the floating gate electrode 411 formed in the process of forming the pixel electrode 4091, both adopt the same mask process, briefing the process, reducing the production costs.

In the other embodiment, on the bottom structure of the dual gate thin film can be also formed the floating gate electrode with two or more materials, such floating gate with two or more materials are required to meet at least one material identical to the pixel electrode, namely, both are formed in the same mask process.

The preferred embodiments according to the present disclosure are mentioned above, which cannot be used to define the scope of the right of the present disclosure. Those variations of equivalent structure or equivalent process according to the present specification and the drawings or directly or indirectly applied in other areas of technology are considered encompassed in the scope of protection defined by the claims of the present disclosure.

What is claimed is:

1. An array substrate, wherein said array substrate comprises a substrate, a thin film transistor formed on said substrate and a pixel electrode, wherein the top of said thin film transistor is formed a floating gate electrode, at least portion of said floating gate electrode and said pixel electrode being made of the same material;
   wherein the floating gate electrode comprises a first floating gate electrode and a second floating gate electrode stacked on the first floating gate electrode;
   wherein the first floating gate electrode and the pixel electrode are commonly made of a metal oxide semiconductor material and the second floating gate electrode is made of a metallic material that is stacked on the metal oxide semiconductor material, such that the floating gate electrode comprises a stacked structure of a metallic material stacked on a metal oxide semiconductor material.

2. The array substrate as claimed in claim 1, wherein said metal oxide semiconductor material is ZnO radical, $SnO_2$ radical or $In_2O_3$ radical metal oxide semiconductor material.

3. The array substrate as claimed in claim 1, wherein said floating gate electrode and said pixel electrode are formed with the same pattern process.

4. The array substrate as claimed in claim 1, wherein said thin film transistor further comprises a bottom gate electrode formed on said substrate, a gate insulating layer set on and covering said bottom gate electrode, a semiconductor layer which is formed on said gate insulating layer and is corresponded with said bottom gate electrode, a source electrode and a drain electrode which are formed on said semiconductor layer and are respectively contacted with two sides of said semiconductor layer, and a passivation layer set on and covering said source electrode and said drain electrode, wherein said gate insulating layer and said passivation layer are further extended between said pixel electrode and said substrate, said passivation layer being provided with a via hole formed therein, said pixel electrode being electrically connected with one of said source electrode and said drain electrode through said via hole.

5. The array substrate as claimed in claim 4, wherein said floating gate electrode and said bottom gate electrode are electrically connected or insulated with each other.

6. A manufacturing method of an array substrate, wherein said manufacturing method comprises the following steps:
   providing a substrate;
   forming a bottom structure of a dual gate thin film transistor;
   forming at least one material layer on the bottom structure of said dual gate thin film transistor by carrying out a pattern process to said material layer, so as to simultaneously form a floating gate electrode and a pixel electrode of said dual gate thin film transistor,
   wherein the floating gate electrode comprises a first floating gate electrode and a second floating gate electrode stacked on the first floating gate electrode;
   wherein the first floating gate electrode and the pixel electrode are commonly made of the material layer that comprises a metal oxide semiconductor material and the second floating gate electrode is made of a metallic material that is stacked on the metal oxide semiconductor material, such that the floating gate electrode comprises a stacked structure of a metallic material stacked on a metal oxide semiconductor material.

7. The manufacturing method as claimed in claim 6, wherein said metal oxide semiconductor material is ZnO radical, $SnO_2$ radical or $In_2O_3$ radical metal oxide semiconductor material.

8. The manufacturing method as claimed in claim 6, wherein the steps of forming at least one material layer on the bottom structure of said dual gate thin film transistor by carrying out a pattern process to said material layer comprises:
   sequentially forming a first material layer comprising the metal oxide semiconductor material and a second material layer comprising the metallic material on the bottom structure of said dual gate thin film transistor and carrying out the pattern process to said first material layer and said second material layer, so as to form said floating gate electrode the stacked the metallic material stacked on the metal oxide semiconductor material and said pixel electrode having a single-layer structure of the metal oxide semiconductor material.

9. The manufacturing method as claimed in claim 6, wherein said floating gate electrode and said pixel electrode of said dual gate thin film transistor are formed with the same pattern process.

10. The manufacturing method as claimed in claim 6, wherein the bottom structure of said dual gate thin film transistor comprises a bottom gate electrode formed on said substrate, a gate insulating layer set on and covering said bottom gate electrode, a semiconductor layer which is formed on said gate insulating layer and is corresponded with said bottom gate electrode, a source electrode and a drain electrode which are formed on said semiconductor layer and are respectively contacted with two sides of said semiconductor layer, and a passivation layer set on and covering said source electrode and said drain electrode, wherein said gate insulating layer and said passivation layer are further extended between said pixel electrode and said substrate, said passivation layer being provided with a via hole formed therein, said pixel electrode being electrically connected with one of said source electrode and said drain electrode through said via hole.

11. The manufacturing method as claimed in claim 10, wherein said floating gate electrode and said bottom gate electrode are electrically connected or insulated with each other.

\* \* \* \* \*